Sept. 28, 1971 P. V. GRAY 3,608,189

METHOD OF MAKING COMPLEMENTARY FIELD-EFFECT TRANSISTORS
BY SINGLE STEP DIFFUSION

Filed Jan. 7, 1970

Inventor:
Peter V. Gray,
by Jerome C. Squillaro
His Attorney.

United States Patent Office 3,608,189

Patented Sept. 28, 1971

3,608,189

METHOD OF MAKING COMPLEMENTARY FIELD-EFFECT TRANSISTORS BY SINGLE STEP DIFFUSION

Peter V. Gray, Scotia, N.Y., assignor to General Electric Company

Filed Jan. 7, 1970, Ser. No. 1,110
Int. Cl. B01j *17/00*; H01g *13/00*
U.S. Cl. 29—571 10 Claims

ABSTRACT OF THE DISCLOSURE

Complementary N-channel and P-channel field-effect transistors are formed on a single conductivity-type semiconductor wafer by a single diffusion step and a single patterning step which separates the N-channel from the P-channel devices. In one embodiment, complementary devices are made by forming an appropriate pattern in a conducting and an insulating film overlying a semiconductor wafer of a first conductivity type, depositing an opposite conductivity type inducing impurity-doped insulating film over the patterned wafer, depositing a first conductivity type inducing impurity-doped insulating film over the first film, removing the impurity-doped films from one portion of the wafer, depositing an opposite conductivity type inducing impurity-doped insulating film over the entire wafer, diffusing the impurities into the wafer to form source and drain regions for one transistor and source, drain and a channel region for the complementary transistor and forming electrical contacts to the source, drain and gate regions of both devices.

Figure 1:
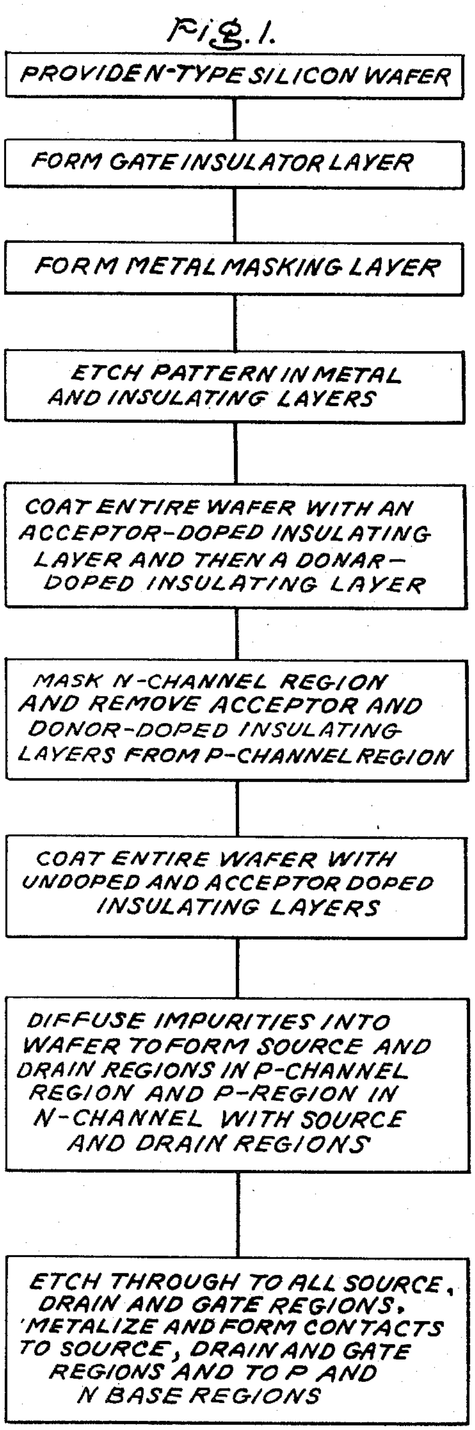

The present invention relates to improved field-effect transistors and methods for making the same. More particularly, the present invention relates to a method for making complementary field-effect transistors on the same semiconductor wafer with only a single diffusion step and a single patterning step which separates N-channel from P-channel devices.

The fabrication of N-channel field-effect transistors (FET) on p-type semiconductor wafers and P-channel FET devices on n-type semiconductor wafers has not presented a serious fabrication problem. However, the fabrication of complementary FET devices on a single conductivity substrate has presented numerous problems. For example, when starting with an n-type substrate, to fabricate an N-channel FET, it is necessary to change the conductivity of the wafer to an opposite type conductivity in the region of the N-channel device. This not only requires an additional diffusion step but also requires additional masking steps which add to the total cost of such devices and tend to reduce the yield thereof. One method for overcoming some of these problems is disclosed in a copending application, Ser. No. 679,957, by Dale M. Brown and William E. Engeler. Complementary FET devices made in accord with the Brown and Engeler application, however, require at least two diffusion steps. While in most applications, this does not present any problems, the total cost of fabrication of such devices can be reduced if the number of process steps can also be reduced.

Accordingly, one object of the present invention is to provide complementary field-effect transistors on a single conductivity type semiconductor wafer with only a single diffusion step.

Still another object of the present invention is to provide complementary field-effect transistors on a single conductivity type wafer with a single diffusion step and a single patterning step which separates N-channel from P-channel devices.

Still another object of the invention is to provide complementary field-effect transistors from a double doped glass diffusion source.

Briefly stated, in accord with one feature of the present invention, complementary field-effect transistors are fabricated by appropriately patterning a metal film overlying an insulated semiconductor wafer of a first conductivity type, depositing an impurity doped insulating layer of an opposite conductivity type inducing impurity over the surface of the wafer, depositing another layer of a first conductivity type inducing impurity doped insulating layer, removing both layers in one region of the wafer and depositing an opposite conductivity type inducing impurity over the entire surface of the wafer, diffusing the impurities into the wafer to form source and drain regions for one device and source, drain and a channel region for the complementary device and making contact to the source, drain and gate regions of each device.

The novel features believed characteristic of the present invention are set forth in the appended claims. The invention itself, together with further objects and advantages thereof, may best be understood by reference to the following detailed description taken in connection with the appended drawing in which:

FIG. 1 is a flow diagram of a method of fabricating complementary field-effect transistors in accord with one embodiment of the present invention; and FIGS. 2*a* through *i*, is a series of schematic illustrations of a vertical corss-section of a semiconductor wafer in the process of fabrication of complementary field-effect transistors in accord with the method of the flow diagram of FIG. 1, each illustration corresponding to one of the process steps in the diagram of FIG. 1.

Figure 2:
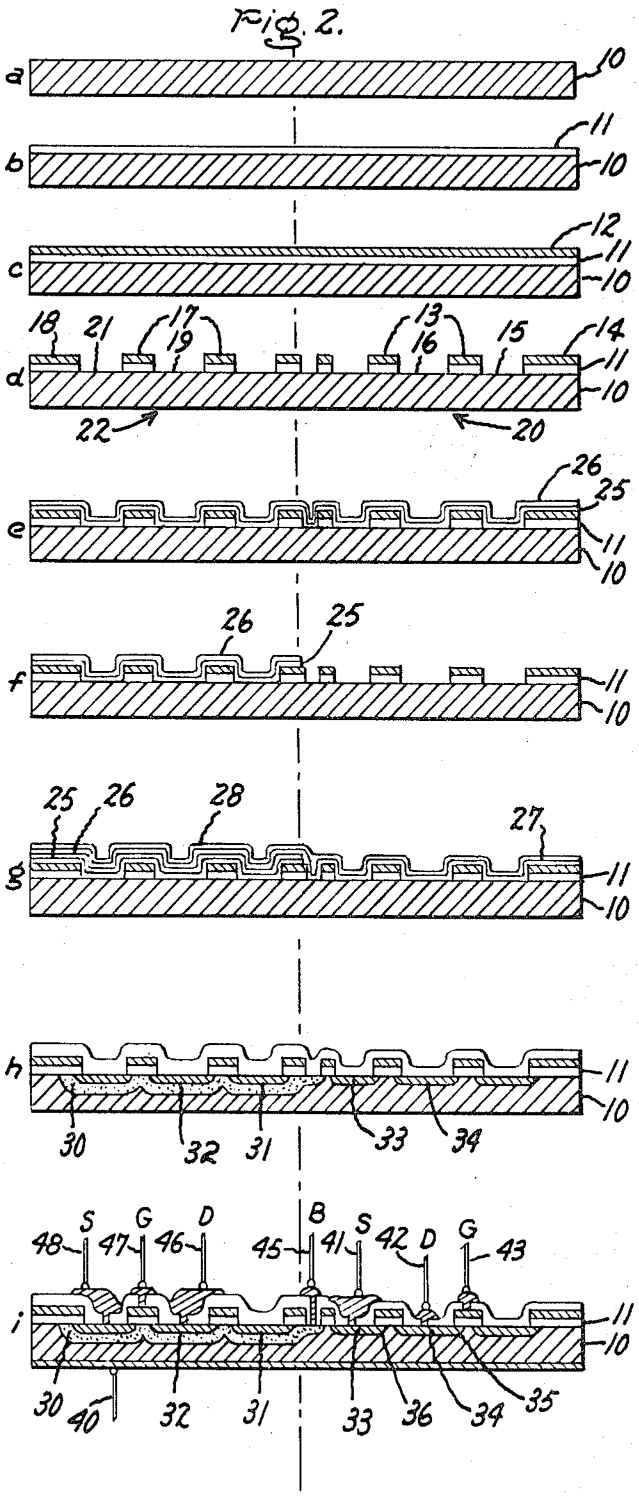

In FIGS. 1 and 2, a plurality of field-effect transistors, each having a concentric configuration and a density of approximately 2500 transistors per square inch, for example, may be formed in accord with one embodiment of the invention upon the surface of an n-type silicon wafer 10 having n-type conductivity characteristics caused by the inclusion therein of a relatively light doping of the order of $10^{16}$ atoms of phosphorus per cubic centimeter thereof. Although the invention may be practised using other semiconductors, such as germanium, gallium arsenide, etc., for ease of description, the invention will be described as practised in forming silicon devices. Such a wafer may be a disc, having a diameter of approximately one inch and a thickness of approximately 0.014 inch.

To begin the process, a suitably prepared wafer 10 of silicon is inserted in a reaction chamber and heated to a temperature of approximately 1000° C. to 1200° C. for approximately 1 to 2 hours in an atmosphere of pure dry oxygen to form a thermally-grown film 11 of silicon dioxide of approximately 1000 A.U. thickness. After thermal growth, the oxide may be annealed in an inert atmosphere, for example, helium to improve the oxide-silicon interface.

After the formation of a film 11 of silicon dioxide upon wafer 10, the oxide wafer is coated with a conductive film 12 of a refractory metal such as molybdenum or tungsten which has good adherence characteristics to the silicon dioxide insulating and passivating film 11 and which is chemically inert in the presence of the insulating film at diffusion temperature, i.e., 1000° C.–1100° C. In addition, the film should be etchable in an etchant to which the passivation film is etch resistant. Such a film 12 may be formed upon the surface of insulating film 11 by sputtering of a molybdenum target in a triode glow discharge of 0.15 torr of argon, for example, for 15 minutes, while the substrate is maintained at a temperature of approximately 400° C. After approximately 15 minutes of sputtering, a thin molybdenum film 12 which may, for example, have a thicknes of 5000 A.U. is formed. The thickness of the molybdenum film is subject to great variation and may readily be controlled by length of exposure to the sputtered refractory metal, as for example, molybdenum. In operation, films as thin as 100 A.U. to 10,000 A.U. may be formed and utilized in accord with the instant invention.

In addition to using the refractory metals, other stable non-reactive conductive materials can be used. For example, deposited silicon could be used for the conductive film 12. Accordingly, it is to be understood that the invention is not limited to metals alone, but rather includes any conductive material which is non-reactive with the insulating film at diffusion temperatures and is capable of functioning as a diffusion mask.

Subsequent to the formation of the film 12, a pattern is formed in the molybdenum film 12 and insulating film 11 by selectively etching portions thereof away by a suitable etchant. To accomplish this, conventional photolithographic techniques using photoresists and irradiation thereof are used. Such techniques are well known in the semiconductor fabrication art and need not be described in any further detail herein. Reference may be made, if desired, to the aforementioned application to Brown and Engeler for additional details.

The configuration of an etched molybdenum film 12 and insulating film 11 having an annular gate electrode-forming member 13 and an apertured peripheral member 14 together with a source-diffusion aperture 15 and a drain-diffusion aperture 16, is illustrated in FIG. 2*d*. Members 13 and 14 comprise metal-remaining portions and apertures 15 and 16 comprise metal-removed portions of a pattern etched in the molybdenum film 12. The aforementioned metal-remaining portions and metal-removed portions form structural features of a first field-effect transistor to be formed in a P-channel region 20 and the structural features of a second complementary field-effect transistor 22 are formed by an annular gate electrode-forming member 17 and an apertured peripheral member 18 together with a source-diffusion aperture 19 and a drain-diffusion aperture 21 as illustrated in FIG. 2*d*. Members 17 and 18 comprise metal-remaining portions and apertures 19 and 21 comprise metal-removed portions of a pattern etched in the molybdenum film 12 which form a part of the complementary transistor to be formed in an N-channel region designated by the numeral 22.

Subsequent to the patterning of the insulating film 11 and molybdenum film 12, a suitable activator-doped film 25 is deposited over the patterned molybdenum film. In the embodiment illustrated, the wafer 10 possesses n-type conductivity characteristics and it is desired to induce source and drain regions therein to form one transistor and source, drain and an opposite conductivity type channel region therein to form the other field-effect transistor, an acceptor-doped insulating material, as for example, boron-doped silicon dioxide glass may be deposited over the entire wafer. This may be achieved by the pyrolysis of a mixture of argon saturated with ethylorthosilicate and partially saturated with triethyl borate. For example, this may be done by bubbling dry argon through ethylorthosilicate at a rate of approximately 7 cubic feet per hour and bubbling dry argon through triethyl borate at a rate of approximately 0.7 cubic foot per hour and passing the two combined flows at a rate of approximately 7.7 cubic feet per hour over the wafer while it is heated to a temperature of approximately 800° C. for approximately 15 minutes to form a 3000 A.U. thick film of boron-doped silicon dioxide.

Subsequent to the formation of the boron-doped silicon dioxide film 25, it is necessary to deposit a thin layer of opposite-conductivity doped insulating material, as for example, a 1000 A.U. thick film 26 of phosphorus-doped silicon dioxide. This may readily be accomplished by pyrolysis from a mixture of argon saturated with ethylorthosilicate and partially saturated with triethyl phosphate. The combination of the two gases is flowed over the wafer while it is maintained at a temperature of approximately 800° C. as was the pyrolysis with triethyl borate.

After the formation of the phosphorus-doped silicon dioxide layer 26, the films 25 and 26, in the P-channel region 20, are photolithographically removed by selective masking and etching by well known techniques, such as those disclosed in an Eastman Kodak publication entitled "Photosensitive Resists for Industry," 1962 edition.

The wafer is then coated with a thin layer of an undoped insulating material 27 such as silicon dioxide which may readily be provided by pyrolysis from a mixture of argon saturated with ethylorthosilicate which may be done, for example, by bubbling dry argon through ethylorthosilicate at a rate of approximately 7 cubic feet per hour for 25 minutes while the wafer is maintained at a temperature of approximately 1000° C.

After formation of the undoped silicon dioxide layer 27, an acceptor-doped insulating layer 28 is formed thereover. For example, a layer of boron-doped silicon dioxide may be deposited over the layer 27 by pyrolysis from a mixture of argon saturated with ethylorthosilicate and partially saturated with triethyl borate as described above. After the formation of the boron-doped silicon dioxide layer 28, the wafer is heated to a diffusion temperature of, for example, 1100° C., and maintained at this temperature for approximately 3 hours. In the N-channel region 22, boron diffuses into wafer 10 to form a p-type region 30 within which opposite conductivity source and drain diffusion regions, 31 and 32, respectively, are also formed. In the P-channel region 20, source and drain diffusion regions 33 and 34, respectively, are formed in the wafer 10. The depth of the source and drain diffusion region 31 and 32, respectively, is controlled by the thickness of the layers 27 and 28 and the diffusion time as is well known in the art.

With source and drain regions formed for the first transistor and source, drain and a channel region for the second transistor, it is next necessary to make electrical contact to the source and drain regions and the gate electrodes of both transistors. This may be accomplished, for example, by photolithographically etching a small circular hole over each of the drain regions 32 and 34, respectively, a thin annulus having a restricted radial thickness over each of the source regions 31 and 33, respectively, and if desired, a relatively small aperture over a portion of base region 30, which provides means to contact the base region 30.

After etching of the holes to both source and drain regions and to both gate electrodes and to the base region of the transistor in region 22, the entire wafer is metallized by vacuum evaporation of aluminum, for example, to cause aluminum to fill the apertures etched by the previous step so as to make contact with source, drain, base and gate electrodes and cover the entire surface of the wafer. The metallized wafer is next coated with a photoresist layer and irradiated through a mask which allows exposure of the regions at which the various contact members are to be made, each electrically isolated from the other, as desired. The metallized wafer is immersed in a suitable etchant for aluminum, as for example, a mixture of orthophosphoric, glacial acetic acid and nitric acid. Alternately, if it is desired that any differing regions are to be internally connected, a connection path may be approriately masked.

The resultant device is illustrated in FIG. 2*i* of the drawing. In this figure, the N-channel portion 22 includes a p-type region 30 which functions as the base for the second transistor with opposite conductivity source and drain regions 31 and 32, respectively, contained therein.

In region 20, the main portion of wafer 10 serves as a base region for a P-channel field-effect transistor and surface-adjacent p-type regions 33 and 34 are diffused therein, defining source and drain p-n junctions 36 and 35, respectively. Metal-remaining region 13 of the patterned molybdenum film 12 constitutes a gate electrode under which a P-channel is located. A base contact 40, a source contact 41, a drain contact 42, and a gate contact 43 are made to each of the respective metallized regions of the first transistor. Similarly, a base contact 45, a source contact 48, a gate contact 47 and a drain contact 46 are made to the respective metallized portions of the second transistor.

It should be understood that although the invention is described with respect to specific source and drain regions, due to the similarity of the regions, their functions may be interchanged if desired. In this way, a greater variety of simplified interconnections is made possible. Accordingly, while each FET has a source and a drain region, these regions may be used interchangeably to accommodate the requirements of the particular application. Additionally, although the p-type base region 30 is illustrated as surrounding source and drain regions 31 and 32, respectivey, FET devices can be fabricated with separate p-type regions around the source and the drain regions. These latter devices are particularly useful when operated in a grounded source configuration.

To more specifically illustrate one embodiment of the instant invention, the fabrication of the complementary channel enhancement mode field-effect transistor device as illustrated in FIGS. 1 and 2 of the drawing is constructed substantially as follows: A (1, 0, 0) surface, one-inch diameter wafer of N-type silicon having a phosphorus concentration therein of $5\times10^{15}$ atoms per cc. and a thickness of 0.014 inch is carefully etched in "white etch" (3 parts HF:one part $HNO_3$), washed in distilled water, and heated in a reaction chamber in an atmosphere of dry oxygen at a temperature of 1000° C. for 2 hours to form a film 1000 A.U. in thickness of silicon dioxide thereover. The wafer is annealed in helium at 1000° C. for 3 hours. The wafer is then heated to a temperature of 400° C. while a 5000 A.U. thick film of molybdenum is deposited thereon in a triode glow discharge with a molybdenum target in 0.015 torr of argon for 20 minutes. A film of KPR photoresist is formed upon the surface of the molybdenum film and a mask having a pattern corresponding to the desired source, drain and gate regions is superimposed over the wafer and the photoresist is irradiated therethrough. After irradiation, the wafer is immersed in photoresist developer, which removes the unirradiated portions of the photoresist and leaves the pattern and region of irradiated portions thereon. The wafer is washed in distilled water and then immersed in an orthophosphoric acid etchant for approximately one minute to cause the removal of the molybdenum exposed through the photoresist pattern.

After removing the etchant and washing in distilled water, the wafer is washed in hot (approximately 180° C.) concentrated sulphuric acid for a short time, e.g., 30 seconds, to remove the protoresist. The exposed insulating layer 11 is then removed by suitable etching techniques in regions not covered by the molybdenum gate electrode. After removing the wafer from the etchant and washing in distilled water, a layer of boron-doped silicon dioxide is next formed on the wafer by pyrolysis of ethylorthosilicate and triethyl borate in a 10:1 volumetric gas ratio. This may be done by bubbling dry argon through ethylorthosilicate at a rate of 7 cubic feet per hour and through triethyl borate at a rate of 0.7 cubic foot per hour. The resultant vapors are mixed and passed over the wafer at a composite flow rate of 7.7 cubic feet per hour. With the substrate wafer at a temperature of 800° C., approximately 3 minutes is sufficient to form a 1000 A.U. thick film of boron-doped silicon dioxide having a boron concentration of $1\times10^{20}$ atoms/cc. in the diffused layer.

A 1000 A.U. thick layer of phosphorus-doped silicon dioxide is next formed on the wafer by pyrolysis of ethylorthosilicate and phosphorus oxychloride, POCl, in a 10:1 volumetric gas ratio. This may be done by bubbling dry argon through ethylorthosilicate at a rate of 7 cubic feet per hour and through POCl at a rate of 0.7 cubic foot per hour. The resultant vapors are mixed and passed over the silicon wafer at a composite flow rate of 7.7 cubic feet per hour. With the substrate wafer at a temperature of 800° C., approximately 1½ minutes is sufficient to form a 1000 A.U. thick film of phosphorus-doped silicon dioxide having a phosphorus concentration of $1\times10^{20}$ atoms/cc. in the diffused layer.

The portion of the wafer in which the N-channel devise is to be formed is then masked with a photoresist, irradiated with ultraviolet light and developed in a photoresist developer. The wafer is then submerged in buffered HF etchant for approximately 2 minutes to remove the boron-doped and phosphorus-doped layers of silicon dioxide from the unmasked portion of the wafer.

The wafer is then washed in distilled water and returned to the reaction chamber where the wafer is coated with a 1000 A.U. thick layer of undoped silicon dioxide by pyrolytic deposition from a mixture of argon saturated with ethylorthosilicate as described above. The wafer is then coated with a 1000 A.U. thick layer of boron-doped silicon dioxide by pyrolysis of ethylorthosilicate and triethyl borate as described above.

The wafer is then placed in a diffusion chamber at a temperature of 1100° C. for approximately 3 hours. The diffusion of the boron into the wafer creates a p-type region within which source and drain regions are formed by the phosphorus diffusion, thereby creating an N-channel FET in an n-type wafer. At the same time, boron diffuses into the wafer in the vicinity of the source and drain regions of the other transistor to form a P-channel FET.

Contacts to the source, drain and gate regions are next formed by etching holes through the insulating layers to contact the source and drain regions and the gate electrode and by depositing a layer of aluminum over the wafer. The aluminum layer is then masked and etched in a conventional manner to form electrode contacts. The wafer is then heated to approximately 500° C. in a hydrogen atmosphere to reduce surface state densities. Electrical connection to the contacts is made by thermocompression bonding.

From the foregoing, it is apparent that there is disclosed a new and useful method of fabricating complementary field-effect transistors on a single conductivity type wafer wherein the resultant device is produced by a single diffusion step and with a single patterning step which separates N-channel from P-channel devices.

While the invention has been set forth herein with respect to certain examples and embodiments thereof, many modifications and changes will readily occur to those skilled in the art. For example, complementary FET devices can be fabricated on a p-type conductivity type wafer by appropriately altering the impurity-doped insulating layers to produce opposite conductivity type characteristics from those described above. In this instance, it is unnecessary to employ an undoped layer of silicon dioxide to slow the rate of diffusion since donor-dopants with slower diffusion rates than acceptor-dopants are available. For example, arsenic diffuses more slowly into silicon than does boron, hence the need for the undoped silicon dioxide layer is obviated. Additionally, whereas the foregoing description of a method for fabricating complementary FET devices has been illustrated with respect to metal oxide semiconductor (MOS) technology, obviously the teachings of the instant invention have equally application to planar transistors and junction FET devices. Accordingly, by the appended claims it is intended to cover all such modifications and changes as fall within the true spirit and scope of the invention.

What I claim as new and desire to secure by Letters Patent of the United States is:

1. A method of forming complementary field-effect transistors on a single conductivity-type semiconductor wafer comprising the steps of:

forming a patterned metal-oxide film overlying a major surface of said semiconductor wafer having metal-oxide removed portions and metal-oxide remaining portions, one of said metal-oxide remaining portions constituting a gate electrode in a first portion of said wafer for a first transistor and another one of said metal-oxide remaining portions constituting a gate electrode in a second portion of said wafer for a second transistor;

deposition first and second conductivity inducing impurity-doped insulating layers over the surface of the patterned metal-oxide film, said first impurity-doped layer having opposite conductivity-type impurity-inducing characteristics in said wafer and said second impurity-doped layer having the same conductivity-type impurity-inducing characteristics in said wafer;

removing said first and second conductivity inducing impurity-doped insulating layers overlying said second portion of said wafer;

depositing a third conductivity-inducing impurity-doped insulating layer over said first and second portions of said wafer;

diffusing said conductivity-inducing impurities into said wafer to form source, drain and base diffusion regions for said first transistor and source and drain regions for said second transistor; and forming electrical contacts to said source and drain regions and said gate electrodes of said field-effect transistors.

2. The method of claim 1 wherein said source and drain regions of said first transistor are formed simultaneously with said base region.

3. The method of claim 1 where said second transistor has conductivity characteristics complementary to those of said first transistor.

4. The method of claim 1 wherein said source and drain regions of said first and second transistors are self-registered with their respective gate electrodes.

5. The method of claim 1 wherein said electrical contacts are made by etching contact apertures through the impurity-doped insulating layers, forming metallic members in the contact aperture to form source and drain contact electrodes and making electrical contact to the electrodes.

6. The method of claim 1 wherein said single conductivity semiconductor wafer is n-type silicon, said first and third impurity-doped insulating layers comprise acceptor impurities and said second impurity-doped insulating layer comprises donor impurities.

7. The method of claim 1 wherein said single conductivity semiconductor wafer is p-type silicon, said first and third impurity-doped insulating layers comprise donor impurities and said second impurity-doped insulating layer comprises acceptor impurities.

8. The method of claim 1 wherein said patterned metal-oxide film is formed by thermally growing an oxide film over a silicon wafer, depositing a thin metal film over the oxide film and patterning the metal film and the oxide film to form an insulated gate electrode and source and drain diffusion apertures.

9. The method of claim 8 wherein said metal is selected from the group consisting of molybdenum, tungsten and silicon.

10. The method of claim 1 wherein said impurity-doped insulating layers are formed by pyrolytic deposition.

References Cited

UNITED STATES PATENTS

| | | | |
|---|---|---|---|
| 3,333,326 | 8/1967 | Thomas et al. | 29—577UX |
| 3,401,319 | 9/1968 | Watkins | 317—235X |
| 3,445,924 | 5/1969 | Cheroff et al. | 29—571 |
| 3,461,361 | 8/1969 | Delivorias | 29—571X |

JOHN F. CAMPBELL, Primary Examiner

W. TUPMAN, Assistant Examiner

U.S. Cl. X.R.

148—187; 317—235A